(12) United States Patent
Lee

(10) Patent No.: US 7,923,333 B2
(45) Date of Patent: Apr. 12, 2011

(54) SEMICONDUCTOR DEVICE AND METHOD FOR FABRICATING THE SAME

(75) Inventor: Sang-Hyun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/473,379

(22) Filed: May 28, 2009

(65) Prior Publication Data

US 2010/0163977 A1    Jul. 1, 2010

(30) Foreign Application Priority Data

Dec. 31, 2008  (KR) .................. 10-2008-0138576

(51) Int. Cl.
*H01L 21/336*    (2006.01)
(52) U.S. Cl. ........ 438/270; 438/589; 257/332; 257/330; 257/E29.262; 257/E21.41
(58) Field of Classification Search ................ 257/332, 257/330, E29.262, E21.41; 438/270, 589
See application file for complete search history.

(56) References Cited

U.S. PATENT DOCUMENTS

| | | | | |
|---|---|---|---|---|
| 5,736,435 | A * | 4/1998 | Venkatesan et al. | 438/151 |
| 7,633,109 | B2 * | 12/2009 | Lee et al. | 257/300 |
| 2006/0022264 | A1 * | 2/2006 | Mathew et al. | 257/331 |
| 2006/0134858 | A1 * | 6/2006 | Yamazaki | 438/243 |

* cited by examiner

*Primary Examiner* — Bradley K Smith
*Assistant Examiner* — Mohammad T Karimy
(74) *Attorney, Agent, or Firm* — IP & T Group LLP

(57) ABSTRACT

A method for fabricating a semiconductor device includes forming a trench in a substrate, forming a gate electrode buried over the trench to form a buried gate pattern, etching portions of the substrate on both sides of the buried gate pattern to a certain depth, performing an ion implantation process on the substrate to form source/drain junctions, and forming metal patterns over the source/drain junctions.

10 Claims, 6 Drawing Sheets

SEMICONDUCTOR DEVICE AND METHOD FOR FABRICATING THE SAME

CROSS-REFERENCE TO RELATED APPLICATIONS

The present invention claims priority of Korean patent application number 10-2008-0138576, filed on Dec. 31, 2008, the disclosure of which is incorporated by reference herein in its entirety.

BACKGROUND OF THE INVENTION

The present invention relates to a method for fabricating a semiconductor device, and more particularly, to a semiconductor device which can reduce an external resistance of a gate and a method for fabricating the same.

As semiconductor devices are scaled down, channel resistance is reduced and threshold voltage is also decreased. Thus, a current gain may be resulted as the channel resistance decreases due to the reduced channel length with respect to operating current.

However, it has become difficult to secure a current gain through the reduced channel length as the scaling down of semiconductor devices continues to use nano technology. The difficulty occurred because a sub-threshold leakage current increases while the channel resistance decreases with the gate channel length being reduced.

In order to reduce the sub-threshold leakage current, a doping concentration level in a gate channel region is being increased. That is, a uniform level of a threshold voltage needs to be maintained as semiconductor devices are being scaled down where a crossing point between on/off states is obtained at the target threshold voltage. In other words, it is difficult to obtain an improved channel resistance with the reduced gate channel length that results in a current gain because the threshold voltage is also increased in order to reduce the leakage current.

Furthermore, a short channel effect may increase due to the reduced channel length, causing mobility degradation to worsen. Thus, the current may be reduced even if the channel length is decreased.

SUMMARY OF THE INVENTION

Embodiments of the present invention are directed to providing a semiconductor device, which can reduce a resistance of a gate, and a method for fabricating the same.

In accordance with an aspect of the present invention, there is provided a method for fabricating a semiconductor device, including: forming a trench in a substrate; forming a gate electrode buried over the trench to form a buried gate pattern; etching portions of the substrate on both sides of the buried gate pattern to a certain depth; performing an ion implantation process on the substrate to form source/drain junctions; and forming metal patterns over the source/drain junctions.

The substrate may include a buried oxide layer formed inside the substrate, and the buried oxide layer may be formed below the buried gate pattern and the source/drain junctions.

The forming of the buried gate pattern may further include, before the forming of the gate electrode buried over the trench: forming spacers over sidewalls of the trench; and forming a gate insulation layer over the surface profile of the trench. The spacers may include a nitride-based layer, and the gate electrode may include a polysilicon layer.

The etching of the portions of the substrate to a certain depth may include: forming a mask pattern having substantially the same line width as the trench; and etching portions of the substrate to a depth smaller than that of the trench by using the mask pattern.

The forming of the metal patterns may include: forming a metal layer over the substrate structure; and planarizing the metal layer until a surface of the buried gate pattern is exposed. The method may further include, after the forming of the metal patterns, forming bit line contacts over the metal patterns.

In accordance with another aspect of the present invention, there is provided a semiconductor device, including: a substrate including a trench; spacers formed over sidewalls of the trench; a buried gate pattern buried over the trench; source/drain junctions formed in the substrate on both sides of the buried gate pattern; and metal patterns formed over the source/drain junctions. The semiconductor device may further include bit line contacts formed over the metal patterns. The source/drain junctions may be formed at a lower position than the buried gate pattern and the metal patterns are formed with a surface flush with a surface of the buried gate pattern.

In accordance with another aspect of the present invention, there is provided a method for fabricating a semiconductor device, comprising: forming a buried oxide layer in a substrate; forming a trench over the buried oxide layer in a substrate; forming a gate electrode buried over the trench to form a buried gate pattern; etching portions of the substrate on both sides of the buried gate pattern to a certain depth; and forming metal patterns over source/drain junctions formed in the substrate.

The forming of the buried oxide layer may include using a mask pattern to etch an oxide-based layer formed over a first silicon layer.

DESCRIPTION OF SPECIFIC EMBODIMENTS

Other objects and advantages of the present invention are understood from the following description, and may become more apparent in connection with different embodiments of the present invention.

Embodiments of the present invention relate to a semiconductor device and a method for fabricating the same. According to the embodiments, leakage current and punch-through breakdown voltage characteristics are enhanced by forming a buried oxide layer in a substrate. Also, a metal pattern is formed over a source/drain junction to decrease an external resistance of a gate which in turn increases an operation current. Consequently, device performance may be enhanced and compatibility as a high-speed device may be increased.

Therefore, the semiconductor device and the method for fabricating the same in accordance with the embodiments of the present invention may be applied to a transistor constituting a speed-related logic such as an input/output sense amplifier (IOSA) driver and an input/output (I/O) buffer where an operation current magnitude plays an important role in the overall speed.

The embodiments of the present invention will be described in detail with reference to the accompanying drawings so that those ordinary persons skilled in the art may be able to enable and use the present invention with ease.

Figure 1:
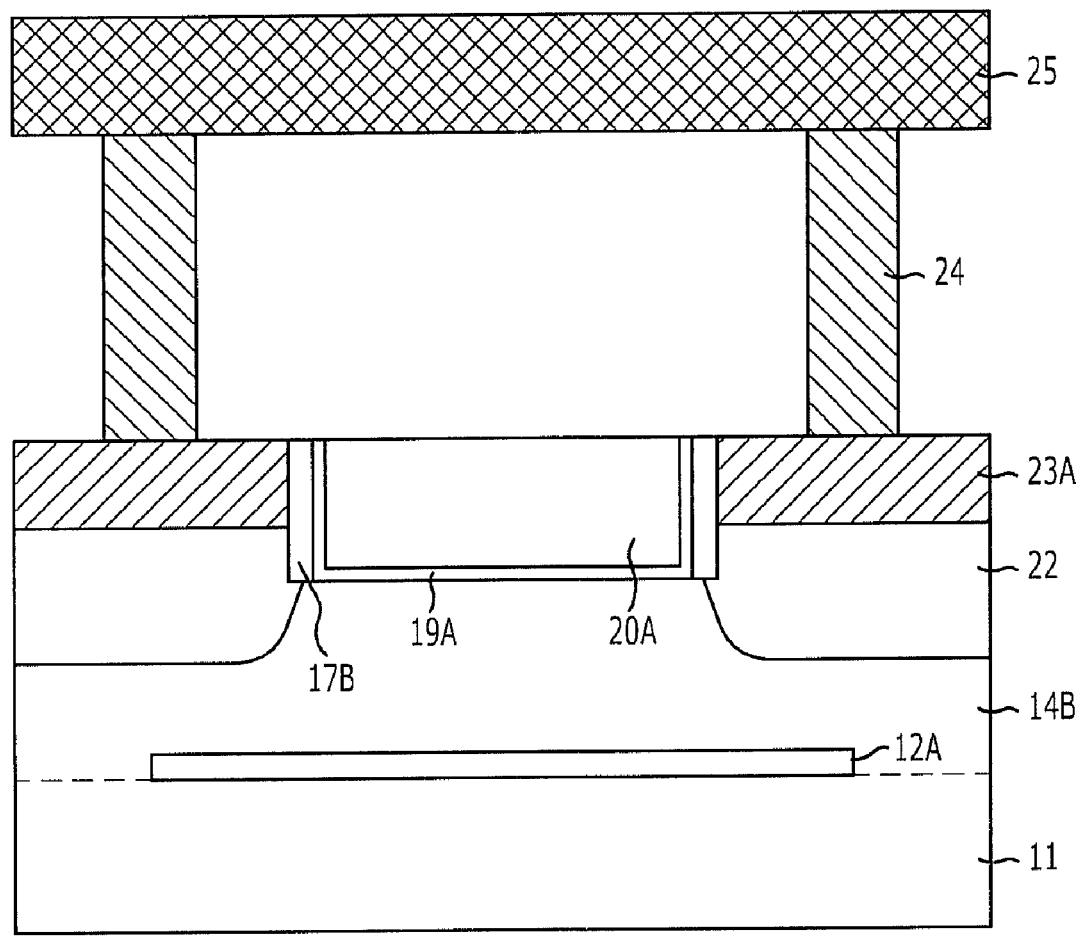
FIG. 1 illustrates a cross-sectional view of a semiconductor device in accordance with an embodiment of the present invention.

FIG. 1 illustrates a cross-sectional view of a semiconductor device in accordance with an embodiment of the present invention.

Referring to FIG. 1, a buried oxide layer 12A is formed inside a substrate including a first silicon layer 11 and an etched second silicon pattern 14B. The buried oxide layer 12A is formed below a buried gate pattern and source/drain junctions to reduce leakage currents flowing to the source/drain junctions and to enhance punch-through breakdown voltage characteristics.

A trench is formed over the etched second silicon pattern 14B. Spacer patterns 17B are formed over sidewalls of the trench, and a gate insulation pattern 19A is formed over the spacer patterns 17B along the surface profile of the trench. A gate electrode 20A is formed over the gate insulation pattern 19A, buried over the trench, to form the buried gate pattern.

Source/drain junctions 22 are formed in the substrate on both sides of the buried gate pattern. At this time, the source/drain junctions 22 are formed at a lower position than the buried gate pattern. The source/drain junctions 22 are formed by performing an ion implantation process on the substrate.

Metal patterns 23A are formed over the source/drain junctions 22. The metal patterns 23A are formed to improve an external resistance. For instance, the metal patterns 23A may be formed using a material having a low resistivity. Also, the metal patterns 23A are formed in a manner that surfaces of the metal patterns 23A are flush with a surface of the buried gate pattern.

Bit line contacts 24 are formed over the metal patterns 23A, and a bit line 25 is formed over the bit line contacts 24.

As described above, according to the embodiment of the present invention, leakage currents flowing to the source/drain junctions 22 may be reduced and punch-through breakdown voltage characteristics may be improved by forming the buried oxide layer 12A in the substrate including the first silicon layer 11 and the etched second silicon pattern 14B, and an external resistance may be reduced by forming the metal patterns 23A over the source/drain junctions 22.

Furthermore, any height difference between the source/drain junctions 22 and the buried gate pattern may be lessened/eliminated by forming the metal patterns 23A over the source/drain junctions 22, thereby improving a bit line contact margin.

Figure 2A:
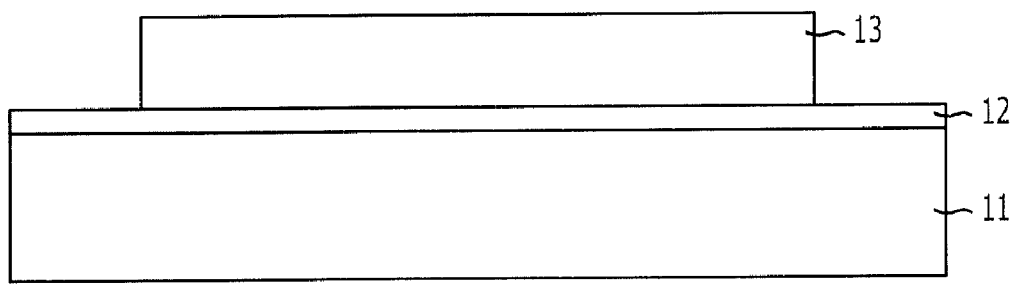
FIGS. 2A to 2I are cross-sectional views describing a method for fabricating a semiconductor device in accordance with the embodiment of the present invention.
Figure 2B:
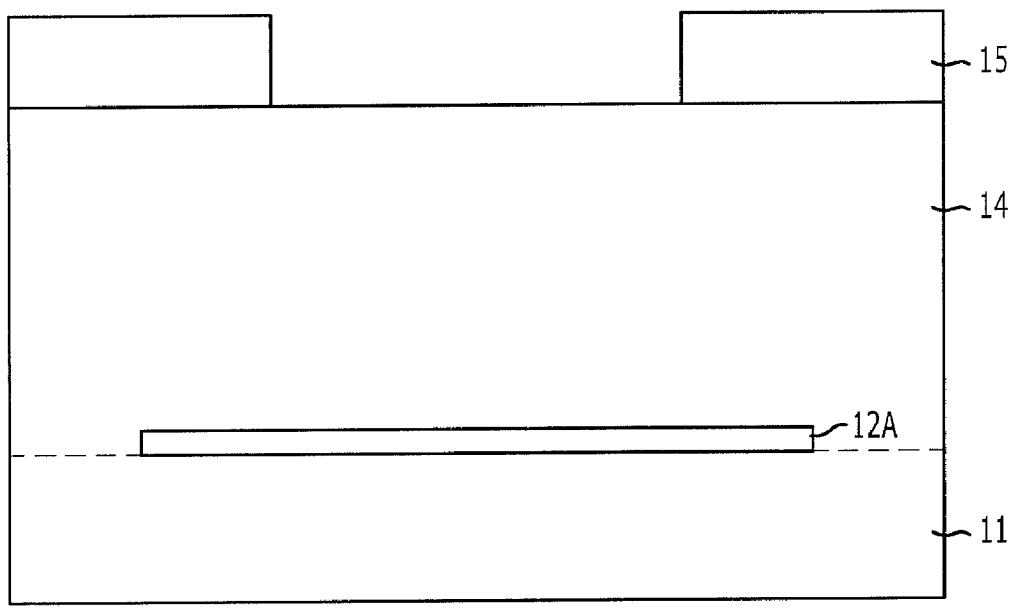
Figure 2C:
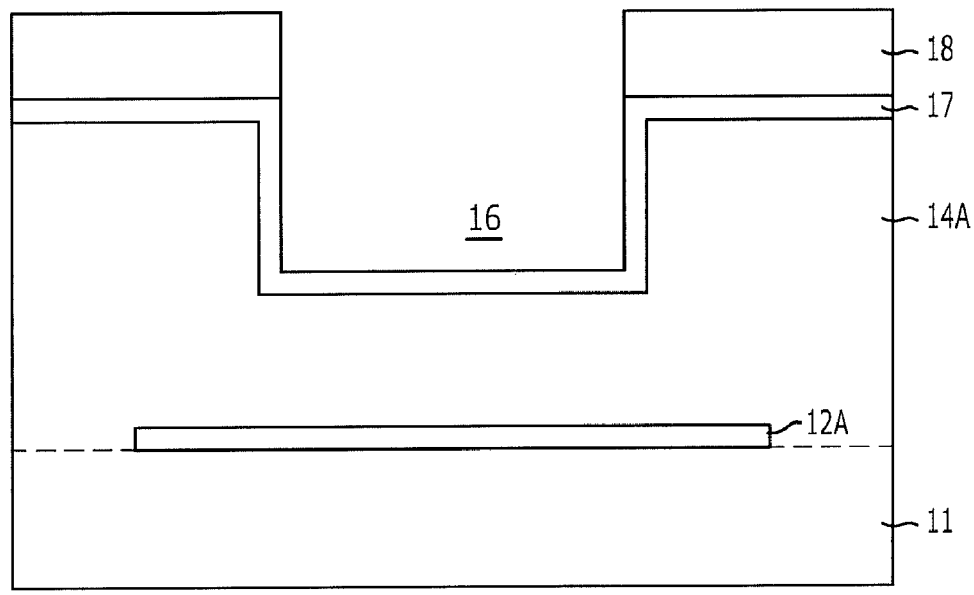
Figure 2D:
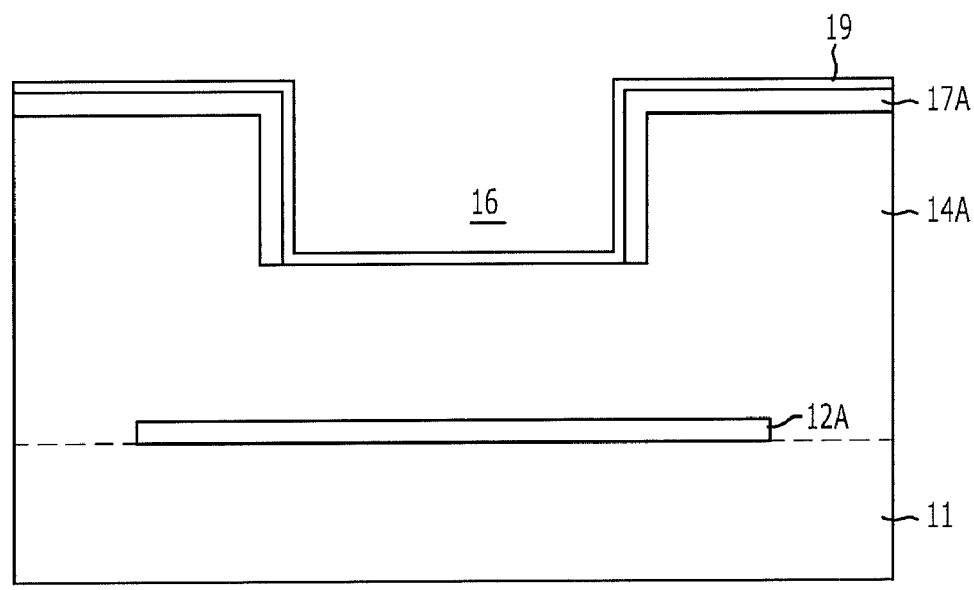
Figure 2E:
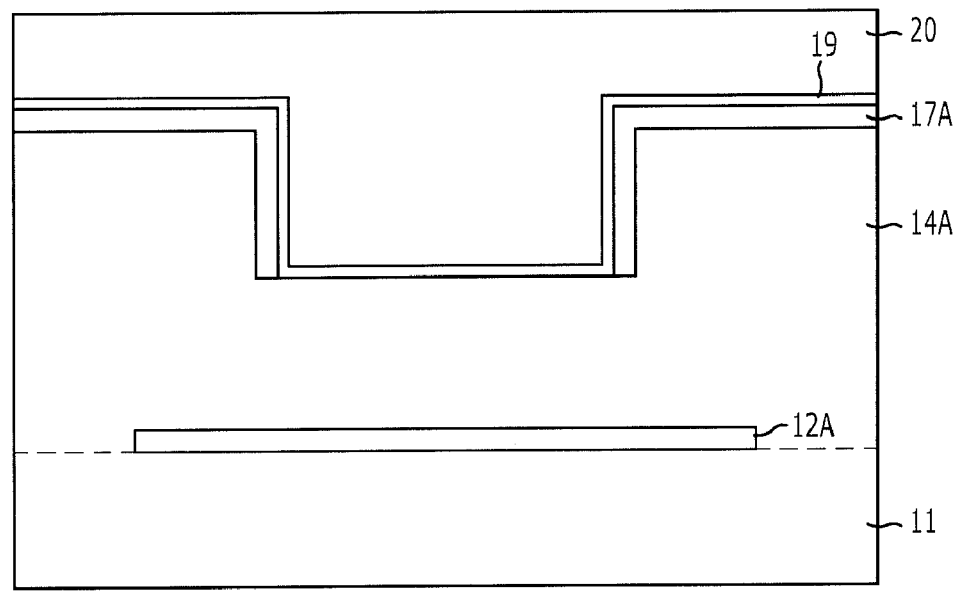
Figure 2F:
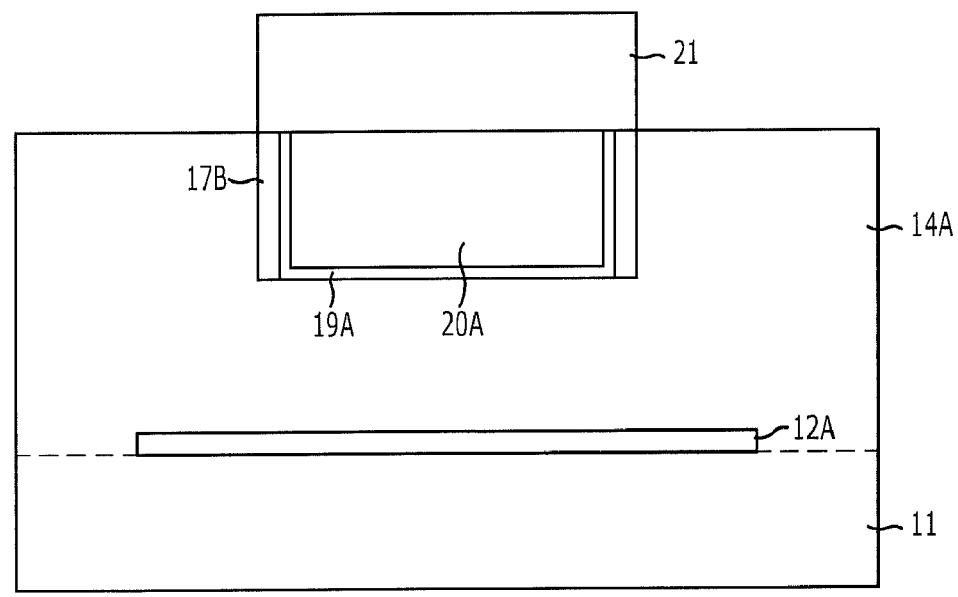
Figure 2G:
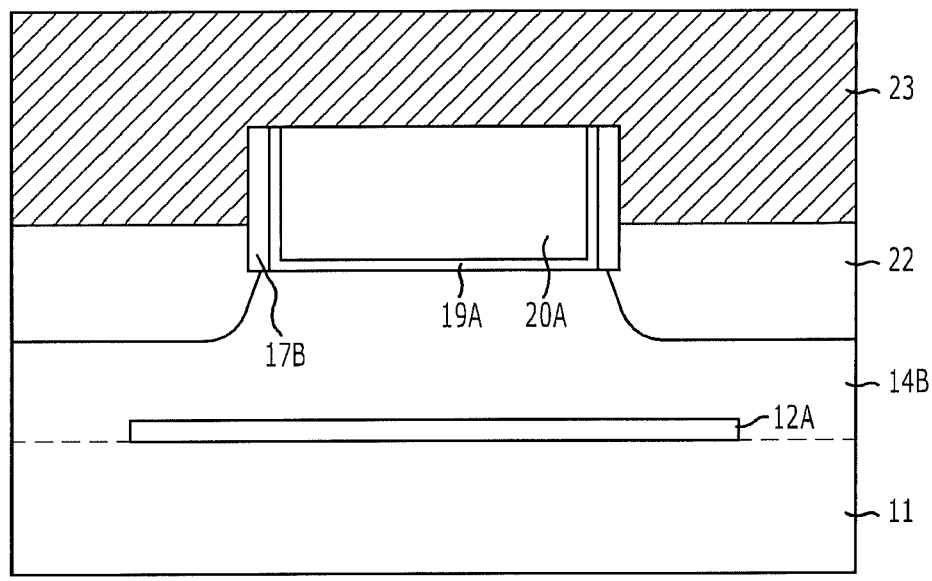
Figure 2H:
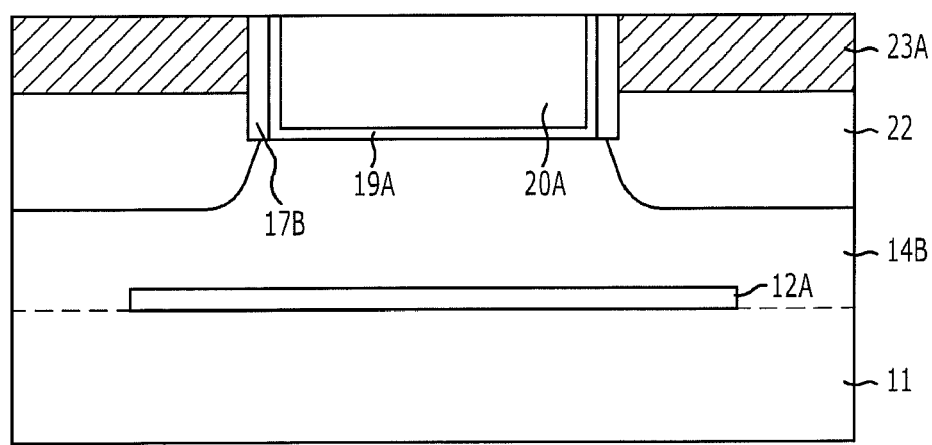
Figure 2I:
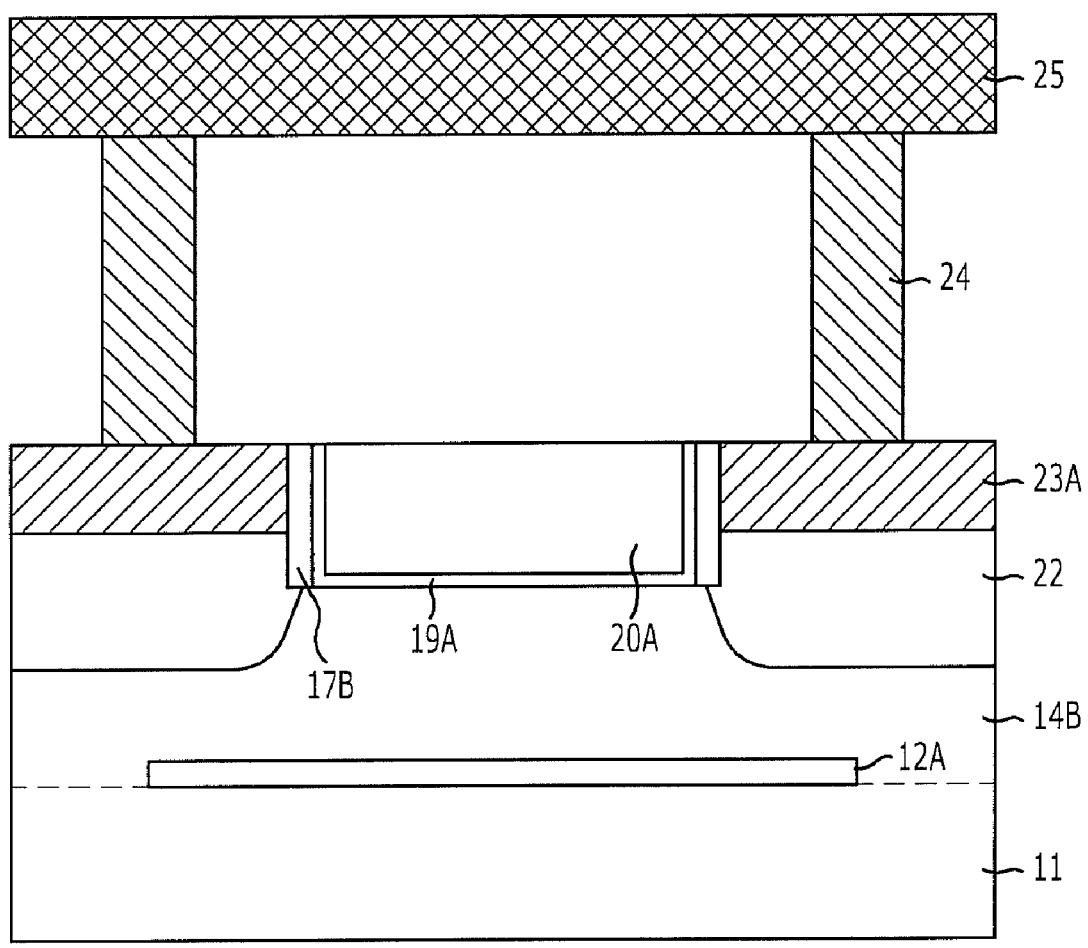

FIGS. 2A to 2I are cross-sectional views describing a method for fabricating a semiconductor device in accordance with the embodiment of the present invention. The same or similar reference numerals throughout FIGS. 1 to 2I represent the same or similar elements for convenience in description.

Referring to FIG. 2A, an oxide-based layer 12 is formed over a first silicon layer 11. The oxide-based layer 12 is used for forming a subsequent buried oxide layer.

A first mask pattern 13 is formed over the oxide-based layer 12. The first mask pattern 13 is patterned in a manner to define a burying region for the oxide-based layer 12. In other words, the first mask pattern 13 is patterned in a manner to define a region predetermined for forming a buried oxide layer which is to be formed mainly below a subsequently buried gate pattern and subsequently formed source/drain junctions.

Referring to FIG. 2B, the oxide-based layer 12 (FIG. 2A) is etched to form a buried oxide layer 12A using the first mask pattern 13 (FIG. 2A) as an etch barrier.

The first mask pattern 13 is then removed. If the first mask pattern 13 includes a photoresist layer, the first mask pattern 13 may be removed by using a dry etch process. The dry etch process may include performing an oxygen removal process.

A second silicon layer 14 is formed over the substrate structure. The second silicon layer 14 is used as a substrate together with the first silicon layer 11. At this time, the second silicon layer 14 may include an undoped polysilicon layer.

After forming the second silicon layer 14, the buried oxide layer 12A is buried in the substrate including the first silicon layer 11 and the second silicon layer 14.

The buried oxide layer 12A formed inside the substrate may improve leakage currents flowing to the source/drain junctions and enhance punch-through breakdown voltage characteristics.

A second mask pattern 15 is formed over the second silicon layer 14. The second mask pattern 15 is patterned in a manner to expose a buried gate pattern region.

Referring to FIG. 2C, the second silicon layer 14 (see FIG. 2B) is etched to form a trench 16 by using the second mask pattern 15 (see FIG. 2B) as an etch barrier. The trench 16 is used for forming a buried gate pattern. Reference number 14A denotes a second silicon pattern 14A.

The second mask pattern 15 is removed. For instance, the second mask pattern 15 may be removed by using a dry etch process, where the dry etch process may include performing an oxygen removal process.

A spacer nitride-based layer 17 is formed over the surface profile of the substrate structure. The spacer nitride-based layer 17 is to be formed over both sidewalls of the trench 16 to function as a barrier of a buried gate pattern.

A third mask pattern 18 is formed over the spacer nitride-based layer 17. The third mask pattern 18 is formed to remove a portion of the spacer nitride-based layer 17 formed at the bottom of the trench 16. Thus, the third mask pattern 18 is patterned in a manner to expose the portion of the spacer nitride-based layer 17 formed at the bottom of the trench 16 while not exposing portions of the spacer nitride-based layer 17 formed over the sidewalls of the trench 16.

Referring to FIG. 2D, the portion of the spacer nitride-based layer 17 (see FIG. 2C) formed at the bottom of the trench 16 is etched to form spacers 17A using the third mask pattern 18 (see FIG. 2C) as an etch barrier.

The third mask pattern 18 is removed. If the third mask pattern 18 includes a photoresist layer, a dry etch process may be used to remove the third mask pattern 18. The dry etch process may include performing an oxygen removal process.

A gate insulation layer 19 is formed over the surface profile of the substrate structure. For instance, the gate insulation layer 19 may include an oxide-based layer. The gate insulation layer 19 may include a thermal oxide layer or a plasma oxide layer.

Referring to FIG. 2E, a polysilicon layer 20 is formed over the gate insulation layer 19, which is buried in the trench 16. The polysilicon layer 20 is used for forming a gate electrode. The polysilicon layer 20 is formed to have a thickness sufficient to fill the trench 16.

Referring to FIG. 2F, the polysilicon layer 20 (see FIG. 2E) is planarized to form a gate electrode 20A buried over the trench 16. The polysilicon layer 20 is planarized until the second silicon pattern 14A is exposed. For instance, the planarization may include performing a chemical mechanical polishing (CMP) process.

Consequently, the spacers 17A (see FIG. 2E) and the gate insulation layer 19 (see FIG. 2E) formed over the second silicon pattern 14A are etched to leave mainly portions inside the trench 16. Portions of the spacers 17A and the gate insulation layer 19 remaining inside the trench 16 are referred to as spacer patterns 17B and a gate insulation pattern 19A, respectively. As a result, a buried gate pattern is formed.

A fourth mask pattern 21 is formed over the gate electrode 20A. The fourth mask pattern 21 is formed to etch the second silicon pattern 14A. The fourth mask pattern 21 is patterned in a manner to have substantially the same line width as that of the trench 16 so that the fourth mask pattern 21 protects the spacer patterns 17B, the gate insulation pattern 19A, and the gate electrode 20A buried over the trench 16.

Referring to FIG. 2G, the second silicon pattern 14A (see FIG. 2F) is etched to a certain depth using the fourth mask pattern 21 (see FIG. 2F) as an etch barrier. For instance, the second silicon pattern 14A is etched to a depth smaller than the depth of the trench 16. Reference number 14B denotes an etched second silicon pattern 14B.

An ion implantation process is performed on the etched second silicon pattern 14B to form source/drain junctions 22. At this time, the fourth mask pattern 21 functions as an ion implantation barrier which prevents ion implantation into the gate electrode 20A while performing the ion implantation process.

The fourth mask pattern 21 is removed.

A metal layer 23 is formed over the source/drain junctions 22 and the gate electrode 20A. At this time, the metal layer 23 is formed to decrease an external resistance. For instance, the metal layer 23 may include a material having a low resistivity.

Referring to FIG. 2H, the metal layer 23 (see FIG. 2G) is planarized to form metal patterns 23A remaining mainly over the source/drain junctions 22. The metal layer 23 is planarized until the gate electrode 20A is exposed. For instance, the metal layer 23 may be planarized using a CMP process.

Referring to FIG. 2I, bit line contacts 24 and a bit line 25 are formed over the source/drain junctions 22. Before forming the bit line contacts 24, an inter-layer insulation layer (not shown) is formed over the substrate structure and the inter-layer insulation layer is selectively etched to form contact holes exposing the metal patterns 23A.

As described above, according to the embodiment of the present invention, leakage currents flowing to the source/drain junctions 22 and punch-through breakdown voltage characteristics may be improved by forming the buried oxide layer 12A in the substrate including the first silicon layer 11 and the etched second silicon pattern 14B, and an external resistance may be enhanced by forming the metal patterns 23A over the source/drain junctions 22.

Furthermore, a height difference between the source/drain junctions 22 and the buried gate pattern may be lessened/eliminated by forming the metal patterns 23A over the source/drain junctions 22, the metal patterns 23A filling the etched portions of the etched second silicon pattern 14B, thereby improving a bit line contact margin.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a trench in a substrate;
   forming a gate electrode buried over the trench to form a buried gate pattern;
   etching portions of the substrate on both sides of the buried gate pattern to a certain depth;
   performing an ion implantation process on the etched portions of the substrate to form source/drain junctions;
   forming a metal layer over the substrate structure including the source/drain junctions; and
   planarizing the metal layer until a surface of the buried gate pattern is exposed to form metal patterns over the source/drain junctions.

2. The method of claim 1, wherein the substrate comprises a buried oxide layer formed inside the substrate.

3. The method of claim 2, wherein the buried oxide layer is formed below the buried gate pattern and the source/drain junctions.

4. The method of claim 1, the forming of the buried gate pattern further comprising, before the forming of the gate electrode buried over the trench:
   forming spacers over sidewalls of the trench; and
   forming a gate insulation layer over the surface profile of the trench.

5. The method of claim 4, wherein the spacers comprise a nitride-based layer.

6. The method of claim 4, wherein the gate electrode comprises a polysilicon layer.

7. The method of claim 1, wherein the etching of the portions of the substrate to a certain depth comprises:
   forming a mask pattern having substantially the same line width as the trench; and
   etching portions of the substrate to a depth smaller than that of the trench by using the mask pattern.

8. The method of claim 1, further comprising, after the forming of the metal patterns, forming bit line contacts over the metal patterns.

9. A method for fabricating a semiconductor device, comprising:
   forming a buried oxide layer in a substrate;
   forming a trench over the buried oxide layer in the substrate;
   forming a gate electrode buried over the trench to form a buried gate pattern;
   etching portions of the substrate on both sides of the buried gate pattern to a certain depth;
   forming a metal layer over the substrate structure including source/drain junctions; and
   planarizing the metal layer until a surface of the buried gate pattern is exposed to form metal patterns over the source/drain junctions.

10. The method of claim 9, wherein the forming of the buried oxide layer comprises using a mask pattern to etch an oxide-based layer formed over a first silicon layer.

* * * * *